United States Patent

Nakajima

[11] Patent Number: 5,986,338
[45] Date of Patent: Nov. 16, 1999

[54] ASSEMBLY OF SEMICONDUCTOR DEVICE

[75] Inventor: Yasushi Nakajima, Kawasaki, Japan

[73] Assignee: Nissan Motor Co., Ltd., Yokohama, Japan

[21] Appl. No.: 08/691,240

[22] Filed: Aug. 2, 1996

[30] Foreign Application Priority Data

Aug. 3, 1995 [JP] Japan .................................. 7-198693

[51] Int. Cl.$^6$ .................................................. H01L 23/053
[52] U.S. Cl. ........................ 257/700; 257/701; 257/778; 257/779
[58] Field of Search .................... 257/778, 779, 257/784, 700, 701, 777

[56] References Cited

U.S. PATENT DOCUMENTS

| 4,672,415 | 6/1987 | Berndes et al. | 257/778 |
| 5,808,872 | 9/1998 | Ozawa | 257/784 |

FOREIGN PATENT DOCUMENTS 2-31437  2/1990  Japan .

*Primary Examiner*—Carl Whitehead, Jr
*Assistant Examiner*—Roy Potter
*Attorney, Agent, or Firm*—Foley & Lardner

[57] ABSTRACT

A semiconductor wafer having one or more pad electrodes is joined to a reinforcing insulator plate formed with a plurality of through holes. On both sides of the reinforcing plate, there are formed conductive layers which are electrically connected through the through holes filled with a first solder. Each conductive layer has electrically separated sections. The wafer and reinforcing plate are joined together by bonding the pad electrodes to the sections of the conductive layer confronting the wafer. The thus-formed assembly of the wafer and plate enables backside grinding of the wafer to a desired thickness to reduce the on resistance of a semiconductor device. The assembly is then divided into chips, and each chip is mounted on a support member such as a lead frame. The backside electrode layer formed on the backside of the chip is bonded to one conductor of the lead frame, and the sections of the topside conductive layer on the reinforcing plate are connected to other conductors of the lead frame by using solders, for example.

15 Claims, 11 Drawing Sheets

ASSEMBLY OF SEMICONDUCTOR DEVICE

BACKGROUND OF THE INVENTION

The present invention relates to assembled structure and assembling process of a semiconductor device, and more specifically to structure and process for a power semiconductor device using electrodes on both sides of a semiconductor wafer and requiring low power consumption.

Bipolar transistor, thyristor, DMOS and IGBT are some examples used as a semiconductor device capable of handling high power. In any case, an important requirement is to reduce power consumption by reducing the on resistance of the semiconductor device, that is the device's resistance in the operating state.

FIG. 17 schematically shows a section of a packaged semiconductor device. In FIG. 17, RW is a resistance of a bonding wire 100, RM is a resistance of a topside pad electrode layer 5, Ra is a resistance of an active semiconductor layer 4 of the semiconductor device, RSi is a resistance of a substrate layer 3 in a semiconductor wafer, RM' is a resistance of a backside metallization electrode 6, RS is a resistance of a solder 11, and RF is a resistance of a lead frame 12. The on resistance of the packaged device is the sum of these individual resistances. Ra and RSi are the components of the semiconductor layers, and all the others are the metallic components. The metallic layers and wire are all essential for the electrical connection. Ra of the active layer 4 is inherent in the semiconductor device. On the other hand, the substrate layer 3 parasitically interposes its resistance RSi in the current path of the semiconductor device. The resistance RSi of the substrate layer 3 is low especially in a wafer for a power semiconductor device. However, a semiconductor is incommensurably higher in resistivity than a metal, and low in heat conductivity. Therefore, reduction of the resistance RSi by reducing the thickness of the substrate layer 3 is remaining measures to reduce the on resistance and hence the power consumption of the semiconductor device.

A widely used conventional packaging process includes a first step of grinding a semiconductor wafer from the backside, a second step of diving the wafer into chips, a third step of bonding one chip to a lead frame, and a fourth step of electrically connecting a pad electrode on the chip to a terminal of the lead frame by wire bonding. However, the wafer becomes more difficult to handle as the wafer thickness is reduced by the backgrinding step. A recent trend toward a larger wafer increases this difficulty. As a result, the reduction of wafer thickness sharply decreases the yield rate of wafers, as shown in FIG. 18. Furthermore, a recent demand for a higher power handling capability tends to increase the size of a chip, and the fragility of a larger chip causes another problem. Thus, reduction of wafer thickness and improvement of production yield are two conflicting requirements.

SUMMARY OF THE INVENTION

It is therefore an object of the present invention to provide structure and process for a semiconductor device which are advantageous in both reduction of a wafer thickness and improvement of production yield.

According to a present invention, an assembly of a semiconductor device comprises a reinforcing insulator plate (7) for supporting a semiconductor piece (such as a wafer or a chip) comprising a first side pad electrode layer and a semiconductor layer having a first side semiconductor surface facing toward the first side pad electrode layer and a second side semiconductor surface opposite to the first semiconductor surface. The reinforcing plate comprises a first side plate surface facing away from the semiconductor piece and a second plate surface facing toward the semiconductor device plate. A plurality of through holes are formed in the reinforcing plate. Each through hole extends from the first side plate surface to the second side plate surface of the reinforcing plate.

The semiconductor device assembly according to the present invention further comprises a second side conductive layer formed on the second side plate surface of the reinforcing plate, and a first side conductive layer formed on the first side plate surface of the reinforcing plate.

The semiconductor device assembly further comprises a first connecting means which comprises a plurality of connecting portions and a connecting layer. Each of the connecting portions extends in one of the through holes and electrically connects the first side conductive layer with the second side conductive layer. The connecting layer is formed between the first side pad electrode layer of the semiconductor piece and the second side conductive layer of the reinforcing plate, for electrically connecting the first side pad electrode layer with the second side conductive layer.

The semiconductor device assembly further comprises a second side electrode layer formed on the second side semiconductor surface of the semiconductor piece to form the semiconductor device with the first side electrode layer so that a main current path of the semiconductor device is vertical between the first side pad electrode layer and the second side electrode layer.

The semiconductor device assembly further comprises a second connecting means for connecting the second side electrode layer of the semiconductor piece to a first lead conductor, and a third connecting means for connecting the first side conductor layer to a second lead conductor.

According to the present invention, a process for making an assembly of a semiconductor device, comprises a hole forming step of forming a plurality of through holes in a reinforcing insulator plate for supporting a semiconductor piece (such as a wafer or a chip) comprising a first side pad electrode layer and a semiconductor layer having a first side semiconductor surface facing toward the first side pad electrode layer and a second side semiconductor surface opposite to the first side semiconductor surface. Each of the through holes extends from a first side plate surface of the reinforcing plate to a second side plate surface of the reinforcing plate.

The process further comprises a second side conductive layer forming step of forming a second side conductive layer on the second side plate surface of the reinforcing plate, and a first side conductive layer preparing step of forming a second side conductive layer on the first side plate surface of the reinforcing plate.

The process further comprises a first connecting step of connecting the first and second side conductive layers by filling a first conductive bonding material in the through holes and joining the semiconductor piece and the reinforcing plate by forming a layer of the first conductive bonding material between the first side electrode layer and the second side conductive layer; a grinding step of grinding the semiconductor piece mounted on the reinforcing plate from the second side semiconductor surface to form a ground semiconductor surface; a second side electrode layer forming step of forming a second side electrode layer on the ground semiconductor surface of the semiconductor piece to form the semiconductor device with the first side electrode layer so that a main current path of the semiconductor device is vertical between the first side pad electrode layer and the second side electrode layer; a second connecting step of bonding the second side electrode layer to a first lead conductor; and a third connecting step of connecting the first side conductive layer to a second lead conductor.

According to the present invention, the structure of the semiconductor piece fixedly supported by the reinforcing plate makes it possible to reduce the thickness of the semiconductor piece to the utmost limit without regard to the strength of the semiconductor chip. By allowing further reduction of the thickness of the semiconductor piece, the present invention can reduce the device's on resistance significantly, and reduce the heat capacity to improve the heat dissipation.

The structure of the reinforcing plate having the opposite conductive layers electrically connected through the through holes by the first bonding material (such as a conductive metallic material or a solder) can provide a low resistance electrical connection from the pad electrode of the semiconductor piece to the outside.

At least one of the conductive layers on the reinforcing plate may comprise a nickel film having a good wettability with a solder. The nickel film facilitates bonding operations, and allows various bonding operations such as conventional wire bonding, or bonding of a ribbon wire or a large-sized conductor by using a solder.

The reinforcing plate having the through holes for electrical connection enables a backgrinding operation in the form of a wafer. Therefore, it is possible to process a large quantity of devices simultaneously and improve the yield as compared with a grinding operation of a chip which is liable to break the angled corners of a chip.

There may be further provided a separating means for preventing the first bonding material from spreading into a boundary zone separating sections of the second side conductive layer and sections of the first side pad electrode layer. The separating means may be stripes which can be cost-effectively formed by screen printing when silicon resin is used. When polyimide resin is employed, a precise pattern of stripes can be readily formed by photolithography using negative photoresist.

The process according to the present invention may further comprise a preparing step for forming the processed semiconductor piece having the first side pad electrode layer.

DETAILED DESCRIPTION OF THE INVENTION

A first embodiment of the present invention is shown in FIGS. 1–7. These figures are to facilitate understanding the structure and process according to the embodiment, so that ratios of vertical and lateral dimensions are not necessarily accurate.

Figure 16:
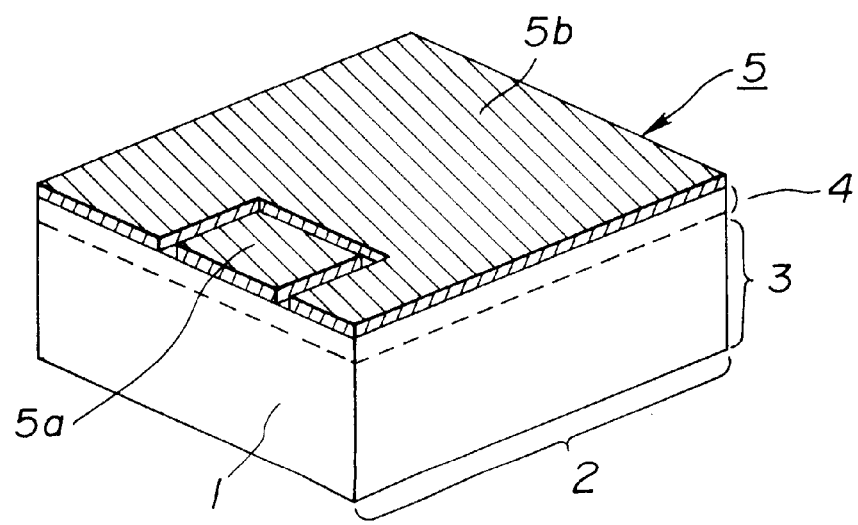
FIG. 16 is a perspective view schematically showing a semiconductor device chip which can be used in the present invention.
Figure 17:
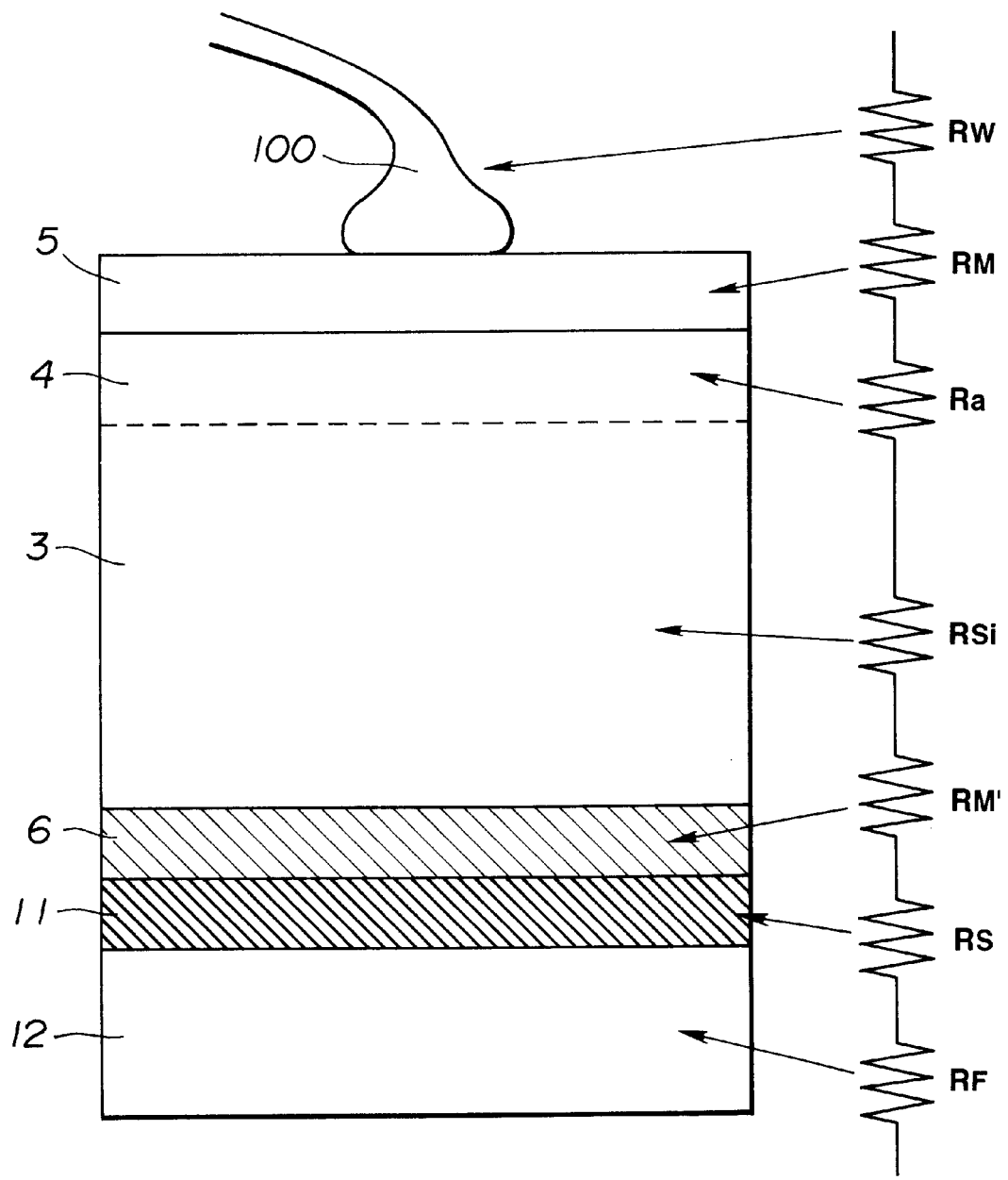
FIG. 17 is a schematic view showing a conventional semiconductor device assembly.
Figure 18:
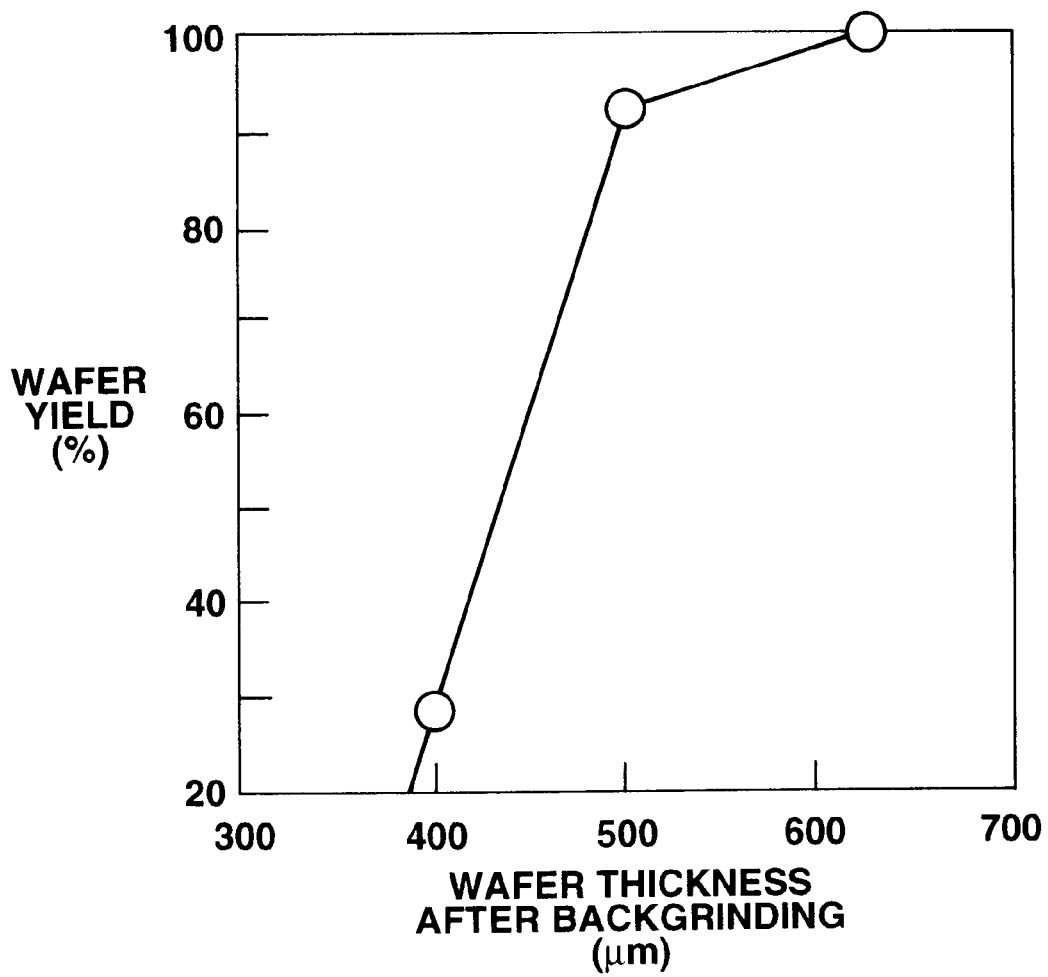
FIG. 18 is a graph showing a relation between a wafer thickness after backside grinding, and a wafer yield.

FIG. 16 shows a semiconductor device chip 2 to which the present invention is applicable. In this example, the semiconductor device is a power vertical MOS field effect transistor, and the chip of this semiconductor device has gate and source electrodes on a first side or top side, and a drain electrode on a second side or back side. An active layer (or region) 4 is a layer formed on one major surface of a silicon wafer 1 according to predetermined specifications. A pad electrode layer (or bonding pad) 5 is formed above the active layer 4 in the chip 2 made from the wafer 1. The pad electrode layer 5 serves also as a means for interconnection. The top side (first side) interconnection pad electrode layer 5 of this example includes a smaller gate electrode 5a, and a larger source electrode 5b occupying a larger area of the chip surface. A semiconductor bulk layer (or region) 3 is under the active layer 4. In general, wafer backgrinding is done to this layer. For example, the bulk layer 3 is an original semiconductor substrate and the active layer 4 is an epitaxial layer in which active semiconductor regions of the MOS transistor are formed. The semiconductor device chip 2 shown in FIG. 16 is illustrative, and the present invention is not limited to this device. The pad electrode used in the present invention may be entirely or partly in ohmic contact or Schottky contact with a semiconductor surface, or may be insulated from the semiconductor surface as an insulated gate electrode. Between the pad electrode layer 5 and the active semiconductor layer 4 shown in FIG. 16, there may be formed a multilevel metallization structure.

Figure 1:
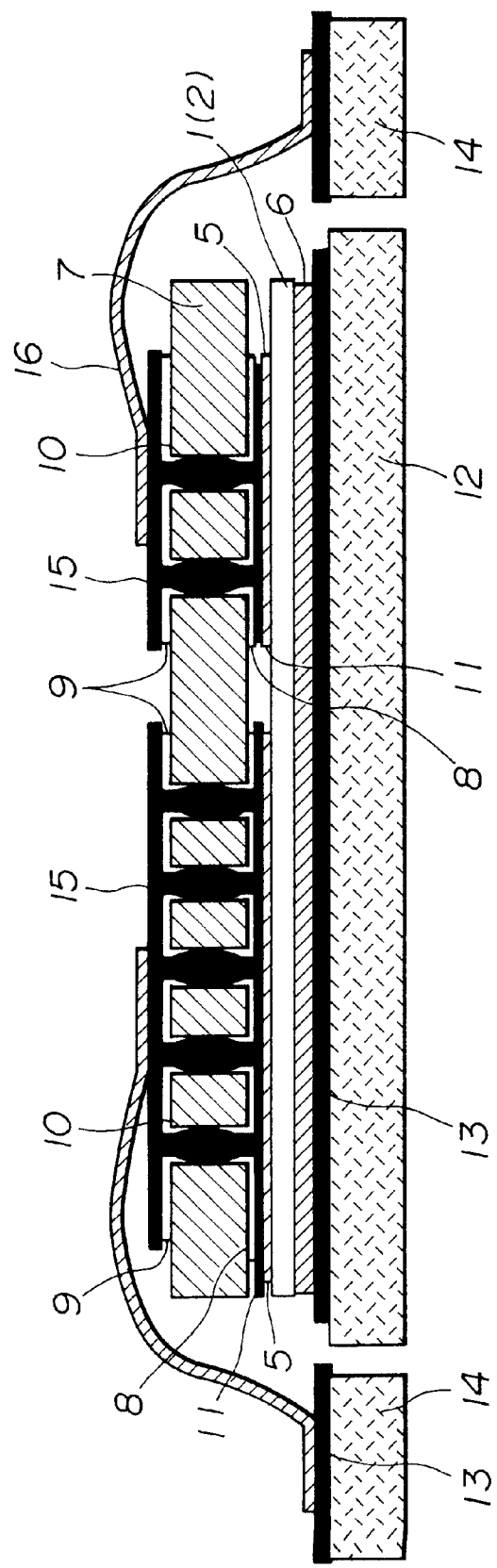
FIG. 1 is a sectional view showing a semiconductor device assembly according to a first embodiment of the present invention.

FIG. 1 shows the semiconductor device assembly according to the first embodiment, in section.

A reinforcing insulator plate 7 is formed with one or more small through holes 10 corresponding to the pad electrode 5 of the chip 2 (or the wafer 1). The through holes 10 passes through the reinforcing plate 7 from a first side (topside) surface to a second side (backside) surface of the reinforcing plate 7. The reinforcing plate 7 is made of a material which is low in thermal resistance and high in insulation resistance.

Two conductive layers 8 and 9 are formed on the opposite sides of the reinforcing plate 7. The conductive layer 8 is formed on the backside (second side) surface of the reinforcing plate 7. The conductive layer 9 is formed on the topside (first side) surface of the reinforcing plate 7. Each of the conductive layers 8 and 9 is made of a metallic material which is low in electric resistivity.

Each conductive layer 8 or 9 has separate sections. The number of the separate sections of each conductive layer 8 or 9 corresponds to the number of the sections of the pad electrode layer 5. In this example, the pad electrode layer 5 has the first and second sections 5a and 5b, and correspondingly each of the conductive layers 8 and 9 has the first and second sections separated from each other. The shape and position of the first section of the conductive layer 8 correspond to the shape and position of the first section 5a of the pad electrode layer 5, and the shape and position of the second section of the conductive layer 8 correspond to the shape and position of the second section 5b of the pad electrode layer 5. In the top view or lateral layout, the first section of the backside conductive layer 8 extends over the first pad electrode section 5a, and the second section of the backside conductive layer 8 extends over the second pad electrode section 5b. The first section of the topside conductive layer 9 extends over the first section of the backside conductive layer 8 and the second section of the topside conductive layer 9 extends over the second section of the backside conductive layer 8.

The through holes 10 are divided into first and second groups. Each through hole of the first group has a backside end opening in the first section of the backside conductive layer 8 and a topside end opening in the first section of the topside conductive layer 9. Similarly, each through hole of the second group has backside and topside ends opening, respectively, in the second sections of the backside and topside conductive layers 8 and 9.

A first conductive bonding material 11 fills the through holes 10 of the reinforcing plate 7, and electrically connects the first sections of the backside and topside conductive layers 8 and 9 together, and the second sections of the conductive layers 8 and 9 together. In this example, the first conductive bonding material 11 is a first solder.

A backside metallization electrode layer 6 is formed on the backside semiconductor surface of the semiconductor device chip 2. The metallic material of the backside metallization layer 6 has a capability of making good ohmic contact with the semiconductor of the chip 2 and a good wettability with a solder.

In this example, the backside electrode layer 6 is the drain electrode, the first section 5a of the pad electrode 5 is the gate electrode, and the second section 5b of the pad electrode 5 is the source electrode. As viewed in FIG. 1, the source electrode is on the left.

The topside pad electrode layer 5 of the chip 2 and the backside conductive layer 8 of the reinforcing plate 7 confront each other, and the topside pad electrode layer 5 and the backside conductive layer 8 are mechanically and electrically bonded with each other by the first solder 11 spreading therebetween. The first combination of the first sections of the pad electrode layer 5, and the conductive layers 8 and 9 which are all electrically connected is separated from the second combination of the connected second sections of the layers 5, 8 and 9.

A second conductive bonding material 13 is used to bond the backside metallic electrode layer 6 of the chip 2 with a first conductor (or electrode) 12 of a support member for mounting the semiconductor chip. In this example, the support member is a lead frame. The second conductive bonding material 13 of this example is a second solder. The metallic material of the backside layer 6 has a good wettability with the second solder 13.

A third conductive bonding material 15 forms first and second bonding sections of a bonding layer, respectively, on the first and second sections of the topside conductive layer 9. In this example, the third bonding material 15 is a third solder.

Ribbon wires 16 connects the first and second bonding sections of the third solder 15 to second and third conductors (or electrodes) 14 of the lead frame. A first end of each ribbon wire 16 is connected to the first or second section of the bonding layer of the third solder 15, and a second end is connected to one of the conductors 14 of the lead frame by the second solder 13.

FIGS. 2–7 show an assembly process of the semiconductor device assembly shown in FIG. 1. These figures show only the portion corresponding to one chip 2.

The pad electrode 5 is formed on the wafer 1. The material of the pad electrode 5 connected to the active layer 4 operating as a semiconductor device need to be capable of alloying with a solder. Therefore, it is preferable to form, on a 4 $\mu$m thick aluminum alloy film comprising aluminum as a main component, a 0.5 $\mu$m thick nickel film and a 1 $\mu$m thick silver film successively. In this case, the pad electrode 5 comprises the aluminum alloy film formed above the semiconductor surface, the nickel film formed on the aluminum alloy film, and the topmost silver film formed on the nickel film. Instead of the aluminum alloy film, it is optional to form a 0.1 $\mu$m thick titanium or chromium film.

Then, the reinforcing plate 7 is formed. The reinforcing plate 7 of this example has the same shape as the semiconductor wafer 1, and is made of a material having good insulating property and a good thermal conductivity. For example, the reinforcing plate 7 is a 600 $\mu$m thick plate made of any one of aluminum oxide, aluminum nitride, magnesium oxide, zirconium oxide, silicon oxide and silicon nitride, or a mixture of any two or more of these oxides and nitrides. Moreover, it is possible to make the reinforcing plate 7 by using any one or more of mica, graphite, beryllia porcelain, oxide superconducting material of yttrium, barium and copper and diamond, in addition to any one or more of the above-mentioned oxides and nitrides or without any of the above-mentioned oxides and nitrides.

Figure 2:
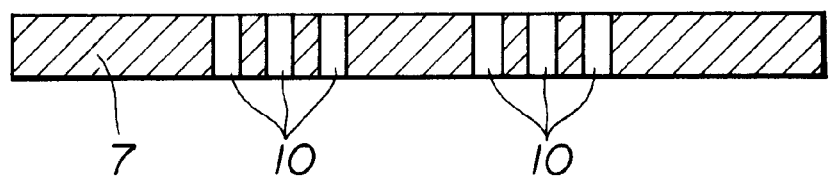
FIGS. 2–7 are sectional views for showing a process for making the semiconductor device assembly according to the first embodiment of the present invention.

Then, the fine through holes 10 are formed in the reinforcing plate 7, as shown in FIG. 2. The fine through holes 10 are formed by mechanical drilling, ultrasonic drilling or electron discharge machining, in the reinforcing plate 7 made of the above-mentioned insulating material. Alternatively, it is possible to form the through holes 10 by oxidizing surfaces of a metallic or silicon plate which are already formed with through holes. When the reinforcing plate 7 is formed by sintering, it is possible to form the through holes by using a forming die. In any case, the through holes 10 must be so small as to be formed in predetermined narrow areas determined by the sections of the pad electrode layer 5, and filled with the solder 11. For example, it is desirable to make the diameter of each through hole 10 approximately equal to or smaller than 1 mm. The number of the through holes 10 can be increased as desired, but the number of the through holes 10 is limited within a range to maintain the strength of the reinforcing plate 7.

Figure 3:
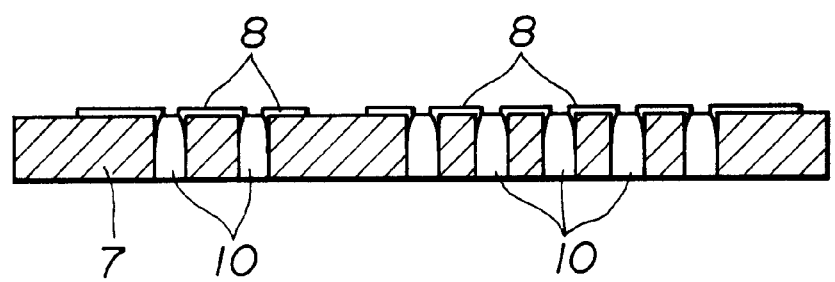

Subsequently, as shown in FIG. 3, the conductive layer 8 is formed on one side of the reinforcing plate 7. For example, the sections of the conductive layer 8 are formed by forming a 10 $\mu$m thick copper film by deposition, electroless plating or attachment of copper foil, then masking the copper film, and patterning the copper film by using an etchant of ferric chloride or the like. Alternatively, it is possible to form the configuration of the conductive layer 8 by attachment of patterned copper foil, selective deposition through a physical mask or a liftoff method of selective deposition through a photoresist mask. Moreover, it is further optional to form the configuration of the conductive layer 8 by a method of printing with metallic paste and baking, or a method of selective plating with masking.

Figure 4:
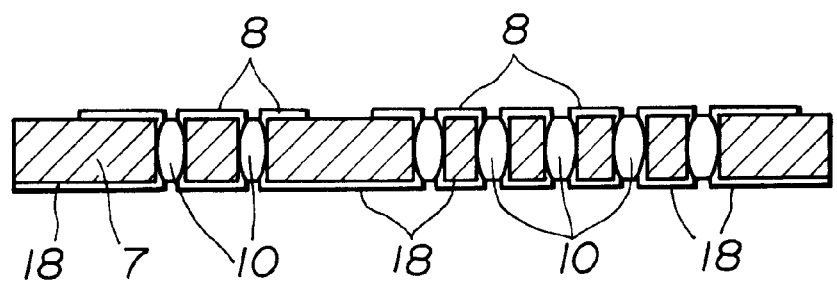

Then, as shown in FIG. 4, a 10 µm thick conductive layer 18 of copper is formed on the opposite side of the reinforcing plate 7, by deposition, electroless plating, attachment of copper foil, or a method of printing and baking with copper paste.

Then, a 500 nm thick nickel layer is formed on the copper layer 8 by plating or deposition, and a 2 µm thick silver layer is formed on the nickel layer by plating or deposition. The nickel and silver layers prevent oxidation of the conductive layer 8 and improve the wettability of the conductive layer 8 with a solder.

Then, the first solder 11 is filled in the through holes 10 to connect the conductive layers 8 and 18. When the molten solder 11 is supplied into the through holes 10, the solder is held in the through holes 10 by the surface tension since the conductive layers 8 and 18 are both wettable with the solder.

Thereafter, the solder 11 is supplied on the conductive layer 8, and the pad electrode layer 5 of the wafer 1 is attached to the solder 11 on the conductive layer 8 while adjusting the alignment between the pad electrode layer 5 of the wafer 1 and the conductive layer 8 of the reinforcing plate 7. Then, the solder 11 is cooled, and the pad electrode layer 5 and the conductive layer 8 are mechanically and electrically connected together. This operation for bonding the pad electrode layer 5 and the conductive layer 8 may be performed after the solder 11 in the through holes 10 is cooled and solidified, or may be performed while the solder 11 in the through holes 10 remains molten.

The reinforcing plate 7 and the wafer 1 are substantially identical in shape and area. Accordingly, the alignment between the pad electrode 5 and the conductive layer 8 can be performed merely by truing up the edges of the reinforcing plate 7 and the wafer 7. When the reinforcing plate 7 is greater in size than the wafer 1, it is advisable to preliminarily form one or more alignment marks on the reinforcing plate 7 to show the contour of the wafer 1.

On the conductive layer 8, the solder 11 is supplied in the form of a cream solder or by deposition. In the case of cream solder, the amount of supply of the solder is set equal to the amount corresponding to the volume of the bonding space between the pad electrode layer 5 and the conductive layer 8, so as to prevent an unwanted electrical connection by an excess amount of the solder.

The thus-constructed assembly of the wafer 1 and the reinforcing plate 7 enables the backside grinding of the wafer 1 as mentioned later.

When the reinforcing plate 7 is made of sintered metal or sintered material of aluminum oxide or aluminum nitride, for example, it is possible to form the conductive layer 8 and the metallic portions filling the through holes 10 by sintering simultaneously with the sintering operation of the insulating material. In this case, too, the conductive layer 8 and the pad electrode layer 5 are bonded together by using the solder 11.

Figure 5:
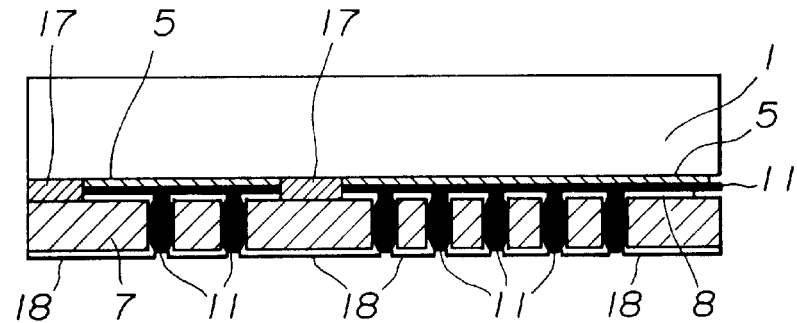

In this example, as shown in FIG. 5, at least one spacer of a sublimable material 17 is formed in the gap between the first and second sections 5a and 5b of the pad electrode layer 5. The sublimable material 17 of this example is naphthalene. The sublimable spacer 17 is formed by pouring naphthalene dissolved in alcohol and then solidifying the naphthalene by drying. The thus-formed spacer 17 can prevent cracks from occurring in the gap between the sections of the pad electrode layer 5 during a grinding operation, and thereby improve the yield and production efficiency. The sublimable spacer 17 can be readily removed by heating, so that the subsequent operations are not adversely influenced.

Figure 6:
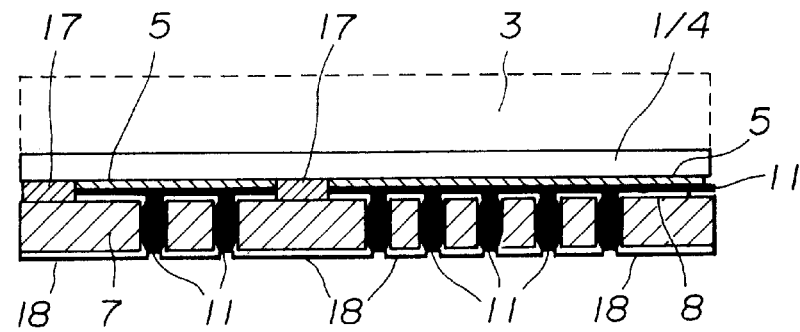

Then, the reinforcing plate 7 is fixed to a grinding machine, and the semiconductor wafer 1 is ground from the back side by mechanical grinding or chemical mechanical polishing, as shown in FIG. 6. In this example, the active layer 4 is 50 µm thick, and accordingly the bulk layer 3 is removed by grinding to the thickness of 60 µm from the surface of the wafer 1. The wafer 1 is fixedly mounted on the reinforcing plate 7, and the assembly of the wafer 1 and the reinforcing plate 7 maintains the sufficient mechanical strength despite the decrease in the thickness of the wafer 1. The reinforcing plate 7 supporting the wafer 1 makes it possible to further reduce the thickness of the wafer 1 beyond a conventional minimum level of about 200 µm, and to remove the bulk layer 3 leaving only the active layer 4. The thus-formed thinner wafer reduces the on resistance of the semiconductor device, and reduces the heat capacity due to reduction of the silicon volume so that the ability of heat radiation is significantly improved.

Figure 19:
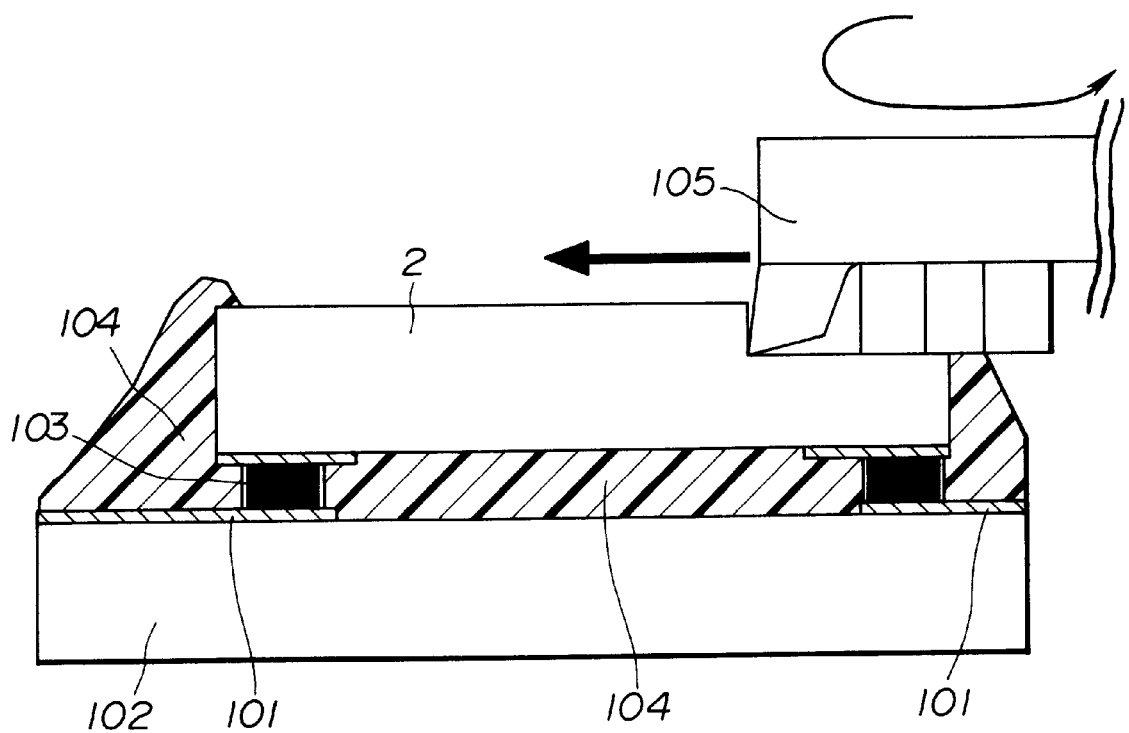
FIG. 19 is a sectional view for illustrating a conventional semiconductor grinding operation.

A Japanese Patent Provisional Publication No. H2-31437 shows a process having a grinding step after a step of bonding a chip to a substrate. In this process, as shown in FIG. 19, a semiconductor chip 2 is first mounted on an insulating substrate 102 on which interconnection patterns 101 are formed for connection of an electric circuit on the chip 2 to an external circuit. The semiconductor chip 2 and the interconnection patterns 101 are electrically connected with solder bumps 103 by face down bonding. Then, the chip 2 is secured to the insulating substrate 102 by epoxy resin 104 which fills a gap formed between the chip 2 and the insulating substrate 102 by the bumps 103 and which surrounds the chip 2. Thereafter, the chip 2 is ground from the backside by a diamond wheel 105. However, this process is possible only after an operation of dividing a wafer into chips. Moreover, the grinding operation in the state of a chip tends to break edges off the chip. The process according to the embodiment of the present invention can overcome these problems of the conventional process.

Figure 7:
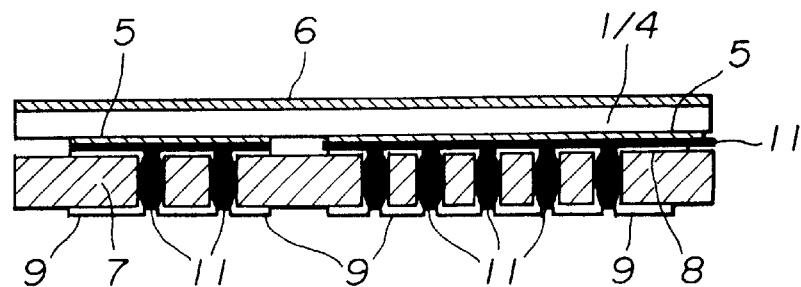

After the grinding step shown in FIG. 6, the spacer 17 is removed by subliming the naphthalene by heating, as shown in FIG. 7. Then, the backside electrode layer 6 is formed on the backside ground semiconductor surface by vacuum deposition or sputter deposition, as shown in FIG. 7. In this example, the backside electrode layer 6 is formed by depositing, at a deposition temperature of about 350° C., a 0.1 µm thick titanium film, a 0.5 µm thick nickel film and a 1 µm thick silver film. Therefore, the backside electrode layer 6 of this examples comprises the titanium film on the semiconductor surface, the nickel film on the titanium film and the silver film on the nickel film. Then, the topside metallic layer 18 on the reinforcing plate 7 is divided into separate sections by patterning to complete the topside conductive layer 9 having the electrically separated sections.

After the patterning operation to complete the topside conductive layer 9, the assembly of the semiconductor wafer 1 and the reinforcing plate 7 is divided by dicing into assembly chips each having the semiconductor chip 2 mounted on a piece of the reinforcing plate 7.

Then, the backside electrode layer 6 of each chip 2 is bonded to the first conductor (or electrode) 12 of the support member by the second bonding material 13, as shown in FIG. 1. In this example, the support member is a lead frame. The second bonding material 13 of this example is the second solder having a melting temperature lower than a solidifying temperature of the first solder 11. The sections of the topside conductive layer 9 are electrically connected to the conductors (or electrodes) 14 of the lead frame, respectively. In this way, the assembly of the semiconductor device is completed.

For connection of the sections of the topside conductive layer 9 with the lead frame conductors 14, it is possible to use bonding wires on the conductive layer 9. The example shown in FIG. 1, however, employs the third solder 15. The use of the third solder 15 helps reduce the resistance of the conductive layer 9, and facilitates connection with ribbon wires 16 or metallic plate like beam leads. The ribbon wire or beam lead metallic plate is greater in cross sectional area, and lower in resistance than the bonding wire. The third solder 15 of this example has a melting temperature lower than a solidifying temperature of the second solder 13. The soldering operation with the third solder 15 having the lower melting point does not impair or damage the already accomplished structure.

In this example, the step of connection to the lead frame conductor 12 is performed after the dicing step of dividing the wafer 1 into chips. This sequence of the steps is desirable also in the case of module package in which the backside layer 6 is bonded to a wiring pattern on an insulating sheet of a metal base. The assembly in which the wafer 1 is reinforced by the reinforcing plate 7 makes it possible to employ a bonding type utilizing pressure because the reinforcing plate 7 can receive the fastening pressure. For example, the reinforcing plate 7 enables use of screw fasteners for connecting the conductive layer 9 to the external circuit. The reinforcing plate 7 can receive pressure produced by tightening the screw fasteners. Therefore, the structure and process according to the present invention is applicable to a semiconductor device, such as a high power thyristor, utilizing a whole wafer without dividing into chips.

Figure 8:
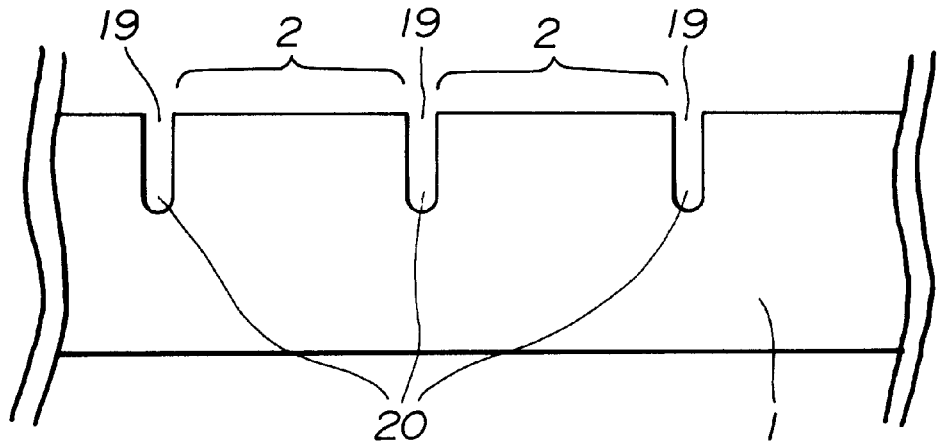
FIGS. 8–10 are sectional views for showing a process for making a semiconductor device assembly according to a second embodiment of the present invention.
Figure 9:
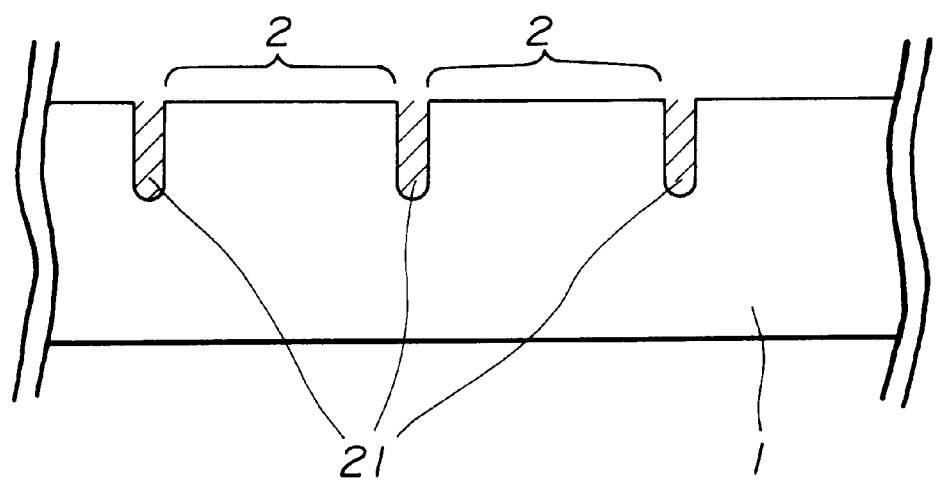
Figure 10:
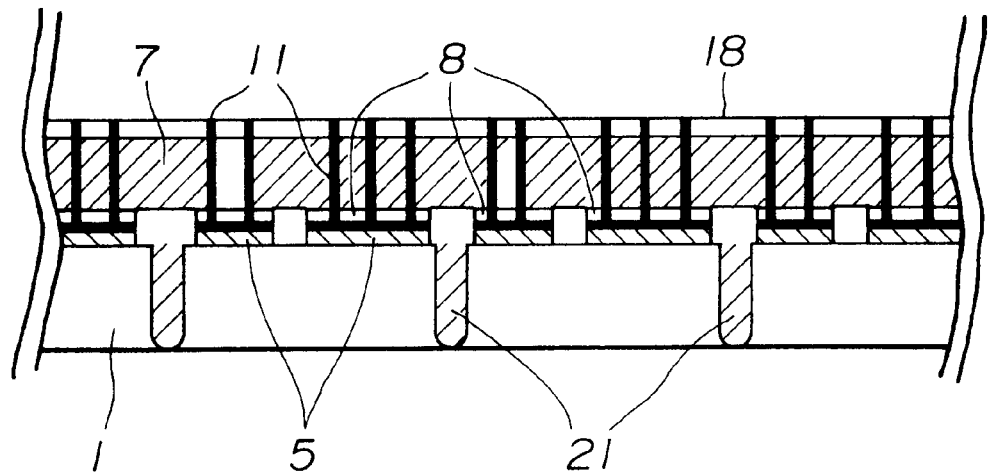

FIGS. 8–10 show a second embodiment of the present invention. In the second embodiment, there are formed, in the semiconductor wafer, stopper regions for limiting the grinding operation. With the stoppers, the wafer is ground accurately to a desired thickness, so that further adjustment of the thickness is not required.

As shown in FIG. 8, trenches 20 are formed in the wafer 1 along scribe lines 19 at an appropriate time in the semiconductor fabricating process. The depth of the trenches 20 is set equal to the desired thickness of the wafer after the grinding operation.

Then, as shown in FIG. 9, the trenches 20 are backfilled by using a dielectric 21 which, in this example, comprises silicon oxide or silicon nitride as a main component.

Thereafter, the wafer 1 and the reinforcing plate 7 are bonded together by the same operations as in the first embodiment. The bonding operation for assembling the wafer 1 and the reinforcing plate 7 into a unit is followed by the backside grinding operation for grinding the wafer from the backside. The backgrinding step of this example comprises a first subordinate step of grinding the wafer 1 with a grinding tool having a diamond blade to a thickness leaving an about 100 μm thick layer, and a second subordinate step of polishing the backside of the wafer by a chemical and mechanical polishing (CMP) method using potassium hydroxide as polishing liquid, and silica particles as polishing abrasive. In the CMP operation, the dielectric 21 in the trenches 20 is not removed, and the lower end of the dielectric 21 serves as etch stopper. Therefore, as shown in FIG. 10, the wafer 1 is ground accurately to the thickness equal to the depth of the trenches 20.

After the grinding step, the wafer 1 is diced, along the dielectric regions 21 in the trenches 20, into chips 2. Then, in the same manner as in the first embodiment, each chip 2 is fixedly mounted on a support member such as a lead frame or a module substrate, and electrically connected with conductors of the support member.

Figure 11:
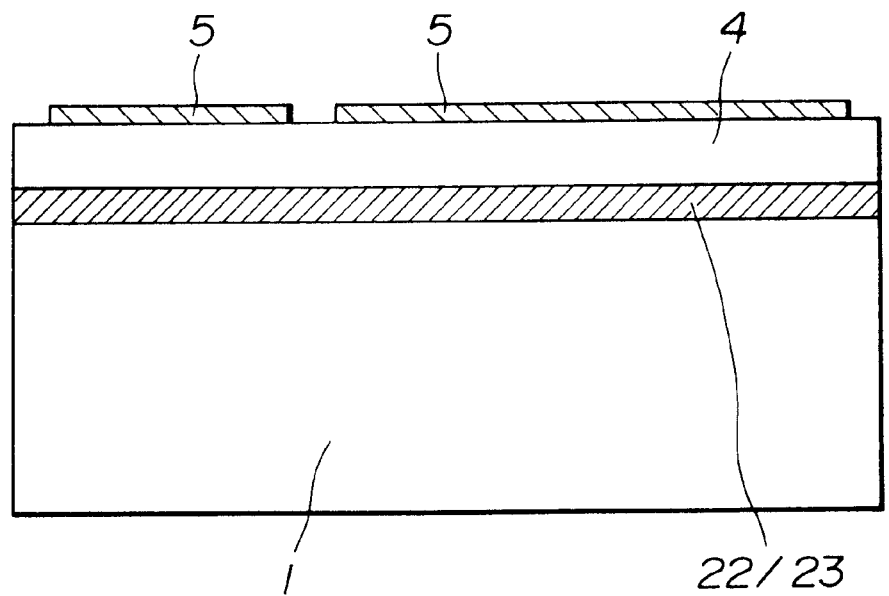
FIG. 11 is a sectional view showing a layer (22/23) which can be used in place of regions (21) shown in FIGS. 9 and 10 of the second embodiment.

FIG. 11 shows a variation of the second embodiment. In the example of FIG. 11, there is formed, in the wafer 1, a stopper layer 22/23 serving as etch stopper, instead of the dielectric stopper regions 21 extending vertically from the wafer surface into the wafer 1. The stopper layer is a layer of a material different from the semiconductor of the wafer. In this example, the stopper layer is a dielectric layer 22 or a silicide layer 23 of a silicide of a metal having a high melting point. The stopper layer is embedded in the wafer by wafer bonding and lapping, in the process for preparing the wafer.

In these examples shown in FIGS. 8–11, the grinding or polishing operation is stopped automatically by the CMP method, or stopped by using a means for detecting a change in grinding torque of a polisher. In the grinding operation, the control of wafer thickness is generally difficult. With the stopper regions 21 or the stopper layer 22/23, it is possible to control the wafer thickness accurately and uniformly, reduce chip to chip variation in thickness, and improve device to device uniformity in on resistance.

FIGS. 12–15 shows various examples according to a third embodiment of the present invention. The third embodiment employs a separating means for preventing the first solder 11 from spreading into a boundary zone 26 during the operation of bonding the conductive layer 8 of the reinforcing plate 7 with the pad electrode layer 5 of the wafer 1. The boundary zone 26 is a zone which electrically separates the sections of the conductive layer 8. The separating means can prevent unwanted electrical connection between the sections 8a and 8b of the conductive layer 8 even when the first solder 11 is nonuniformly supplied onto the conductive layer 8. The separating means extends along the boundary zone 26.

Figure 12:
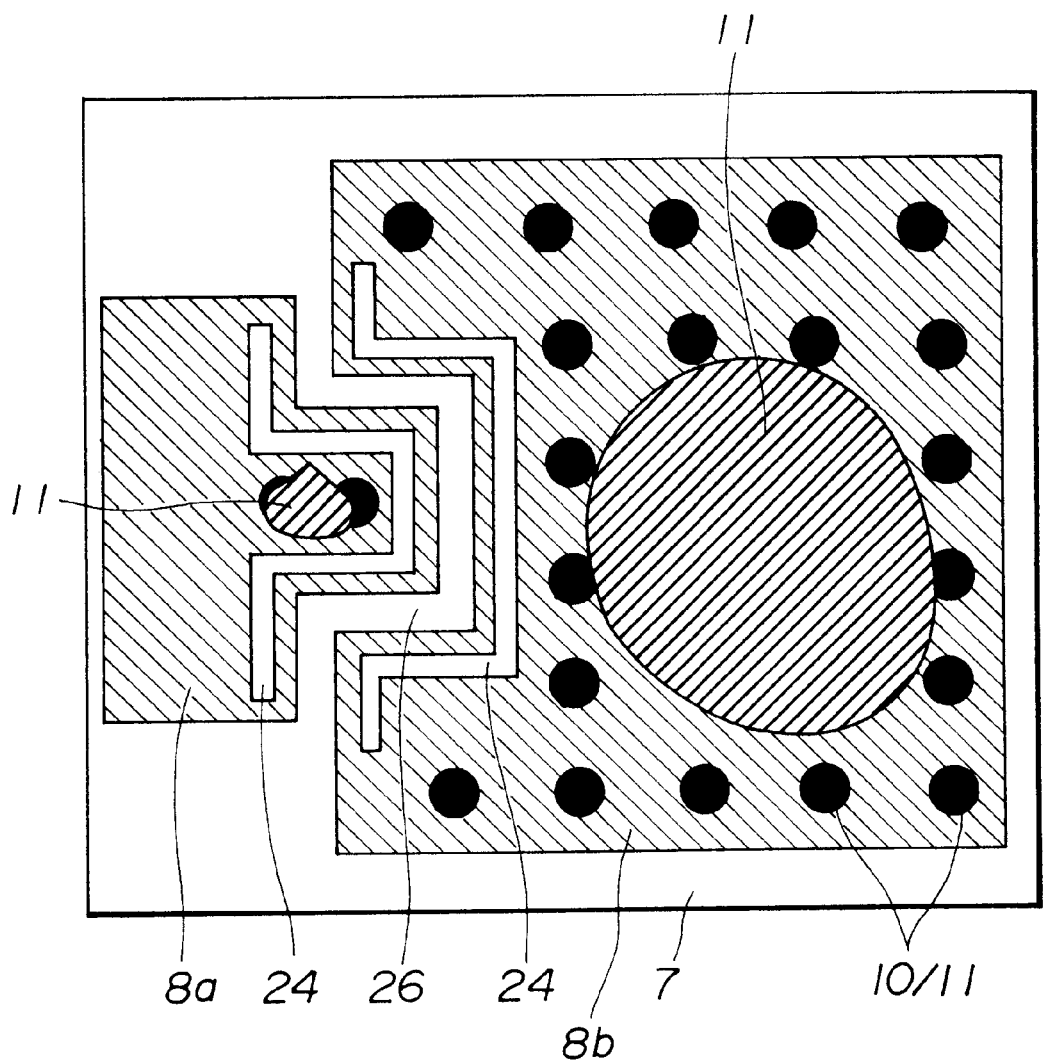
FIG. 12 is a top view showing slits (24) formed in a semiconductor device assembly of a first example according to a third embodiment of the present invention.

In an example shown in FIG. 12, the separating means is in the form of slits 24. The first slit 24 is formed in the first section 8a of the conductive layer 8, and the second slit 24 is formed in the second section 8b of the conductive layer 8. Each slit 24 extends along the boundary zone 24 separating the first and second sections 8a and 8b of the conductive layer 8. In each slit 24, the material of the conductive layer 8 is removed. The slits 24 extend so as to separate the first group of the through holes 10 opening in the first section 8a of the conductive layer 8 and the second group of the through holes 10 opening in the second section 8b of the conductive layer 8. Each slit 24 serves as a sink for absorbing an excess amount of the solder 11.

Figure 13:
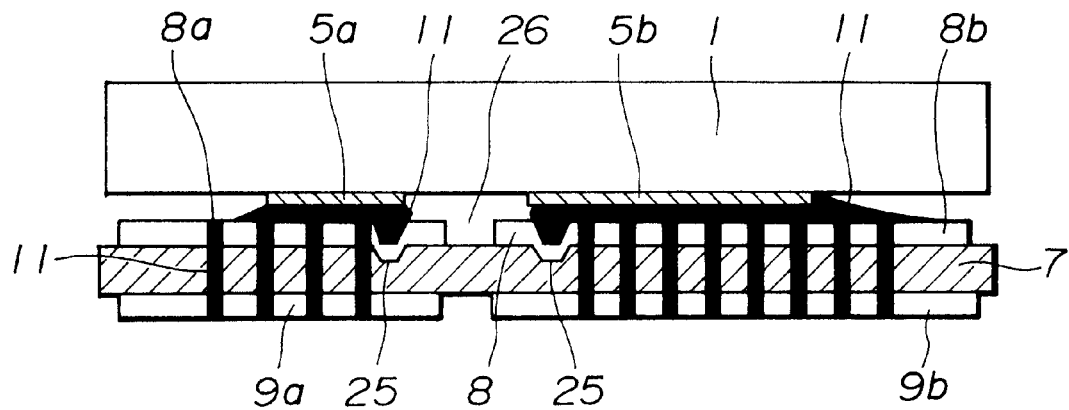
FIG. 13 is a sectional view showing grooves (25) formed in a semiconductor device assembly of a second example according to the third embodiment of the present invention.

In an example shown in FIG. 13, the separating means is in the form of grooves 25 formed in the backside surface of the reinforcing plate 7. The conductive layer 8 is depressed in the grooves 25, as shown in FIG. 13. The grooves 25 extend along the boundary zone 26 in the same manner as the slits 24. An excess amount of the solder 11 is absorbed in the grooves 25.

Figure 14:
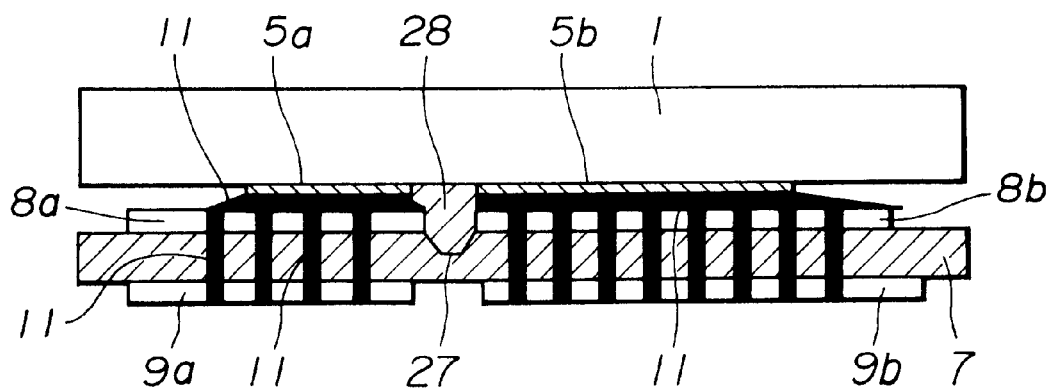
FIG. 14 is a sectional view showing a barrier (28) formed in a semiconductor device assembly of a third example according to the third embodiment of the present invention.

In an example shown in FIG. 14, the separating means is in the form of a barrier wall 28 for blocking passage of the solder 11 across the boundary zone 26. The barrier wall 28 extends in the boundary zone 26 so as to separate the first and second sections 8a and 8b of the conductive layer 8 and separate the first and second sections 5a and 5b of the pad electrode layer 5. As shown in the sectional view of FIG. 14, the barrier wall 28 extends vertically from the surface of the wafer 1 to the surface of the reinforcing plate 7. In the example of FIG. 14, the reinforcing plate 7 is formed with a depression 27 in which the barrier wall 28 is planted. The barrier wall 28 is made of an insulating material which is low in wettability with the solder 11, and free from thermal metamorphism at the melting temperature of the first solder 11. For example, the barrier 28 is made of silicon resin or polyimide resin.

Figure 15:
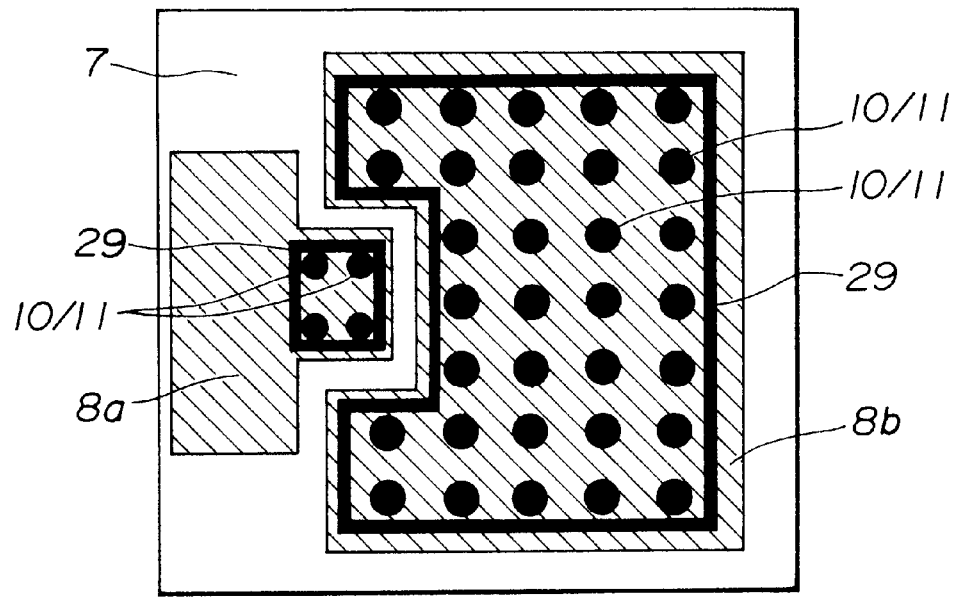
FIG. 15 is a top view showing stripes (29) formed in a semiconductor device assembly of a fourth example according to the third embodiment of the present invention.

In an example shown in FIG. 15, the separating means is in the form of barrier stripes 29 having a uniform thickness. In the example shown in FIG. 5, the first group of the through holes 10 opening in the first section 8a of the conductive layer 8 is enclosed by the first closed barrier stripe 29, and the second group of the through holes 10 opening in the second section 8b of the conductive layer 8 is enclosed by the second closed barrier stripe 29. The barrier stripes 29 are formed on either or both of the conductive layer 8 of the reinforcing plate 7 and the pad electrode layer 5 of the wafer 1. The barrier stripes 29 are made of an insulating material which is low in wettability with the solder 11, and free from thermal metamorphism at the melting temperature of the first solder 11. Each of the closed stripes 29 prevents the first solder 11 from extending out of the enclosed region. Furthermore, the interposition of the stripes 29 of the uniform thickness prevents the spacing between the wafer 1 and the reinforcing plate 7 from being varied by the thickness of the solder 11, and helps hold the wafer 1 and the reinforcing plate 7 parallel and make the spacing therebetween uniform. Therefore, the uniformity of wafer thickness within a single wafer after grinding can be further improved.

When the silicon resin is used as the material of the barrier stripes 29, it is easy to form the stripes 29 in large quantities by screen printing. The required positional accuracy of the stripes 29 only corresponds to the dimensions of the sections 5a and 5b of the pad electrode 5, and the screen printing can meet this requirement of accuracy. When the polyimide resin is used as the material of the stripes 29, it is possible to form the stripes 29 by the screen printing method as mentioned above, or by the following process. First, a layer of polyimide resin is formed on the wafer 1 or the reinforcing plate 7 by spin coating, and then novolak type positive photoresist is applied. Exposing radiation is then transmitted through a mask, and a pattern of the mask is transferred to the photoresist layer. After this exposing and image transferring step, the photoresist layer is developed by using a developer liquid, and unwanted polyimide resin is removed. Thereafter, the positive photoresist is removed.

When photosensitive polyimide resin is employed as the material of the stripes 29, a precise pattern can be readily formed like a resist operation in an ordinary semiconductor fabrication process. In this case, the process includes a coating step of forming a photosensitive polyimide resin layer on the wafer 1 or the reinforcing plate 7 by spin coating. The coating step is followed by an exposure step for image transfer using a mask, and a step for removing unwanted portions of the polyimide resin layer by using a developer.

A fourth embodiment of the present invention employs a fourth solder to assemble an external circuit connected with the semiconductor device. In the preceding embodiments, the first and second solders are different in melting and solidifying points. The melting temperature of the second solder is lower than the solidifying temperature of the first solder which is equal to or lower than the melting temperature of the first solder. By using these solders and adjusting the fusing time, it is possible to perform a subsequent soldering operation without destroying the structure formed by a previous soldering operation. In addition to this inequality, the solders according to the fourth embodiment satisfy the following relations. The melting temperature of the third solder is lower than the solidifying temperature of the second solder which is equal to or lower than the melting temperature of the second solder. The melting temperature of the fourth solder is lower than the solidifying temperature of the third solder which is equal to or lower than the melting temperature of the third solder. With these solders, it is possible to perform the soldering operations successively at different temperatures without destroying the structure produced by the previous operation and to complete the structure according to the present invention independent of the fusing time. Accordingly, the flexibility of the process planning is improved.

In the present invention, it is desirable to form a nickel film, at least in a region in which one of the solder is diffused, on each of all the metallic conductive layers of the reinforcing plate 7 and the electrode layers of the wafer 1. The nickel film can improve the wettability with a solder, provide a barrier for preventing further diffusion of a solder, and improve the reliability by preventing the device from being contaminated by heavy metal.

What is claimed is:

1. An assembly of a semiconductor device, said assembly comprising:

a reinforcing insulator plate for supporting a semiconductor piece comprising a first side pad electrode layer and a semiconductor layer having a first side semiconductor surface facing toward said first side pad electrode layer and a second side semiconductor surface opposite to said first side semiconductor surface, said reinforcing plate comprising a first side plate surface facing away from said semiconductor piece and a second side plate surface facing toward said semiconductor piece, and said reinforcing plate being formed with a plurality of through holes extending from said first side plate surface to said second side plate surface;

a second side conductive layer formed on said second side plate surface of said reinforcing plate;

a first side conductive layer formed on said first side plate surface of said reinforcing plate;

a first connecting means comprising a plurality of connecting portions each of which extends in one of said through holes and electrically connects said first side conductive layer with said second side conductive layer, and a connecting layer formed between said first side pad electrode layer and said second side conductive layer for electrically connecting said first side pad electrode layer with said second side conductive layer;

a second side electrode layer formed on said second side semiconductor surface of said semiconductor piece to form the semiconductor device with said first side pad electrode layer so that a main current path of the semiconductor device is vertical between the first side pad electrode layer and the second side electrode layer;

a second connecting means for connecting said second side electrode layer of said semiconductor piece to a first lead conductor; and a third connecting means for connecting said first side conductive layer to a second lead conductor;

wherein said connecting portions and said connecting layer of said first connecting means are all made of a first conductive layer of said first connecting means are all made of a first conductive bonding material, and said second connecting means comprises a connecting layer of a second conductive bonding material which is formed between said second side electrode layer and said first lead conductor; and wherein said third connecting means comprises a connecting portion of a third conductive bonding material for connecting said first side conductive layer to said second lead conductor and wherein said first, second and third bonding materials are all solders, a melting temperature of said second bonding material is lower than a solidifying temperature of said first bonding material, and a melting point of said third bonding material is lower than a solidifying temperature of said second bonding material.

2. An assembly as claimed in claim 1 wherein said second side electrode layer is made of a metallic material having a capability of forming ohmic contact with said second side semiconductor surface, and a wettability with said second bonding material, wherein said reinforcing insulator plate is made of an insulating material which is higher in electric resistivity than each of said first side conductive layer, said second side conductive layer and said first bonding material; and wherein each of said through hole has a first side end opening in said first side conductive layer and a second side end opening in said second side conductive layer.

3. An assembly as claimed in claim 1 wherein said assembly comprises a region of a fourth bonding material for connecting said semiconductor device with an external device, the melting temperature of said second bonding material is lower than the solidifying temperature of said first bonding material which is equal to or lower than the melting temperature of said first bonding material, the melting temperature of said third bonding material is lower than the solidifying temperature of said second bonding material which is equal to or lower than the melting temperature of said second bonding material, and the melting temperature of said fourth bonding material is lower than a solidifying temperature of said third bonding material which is equal to or lower than the melting temperature of said third bonding material.

4. As assembly of a semiconductor device, said assembly comprising:

a reinforcing insulator plate for supporting a semiconductor piece comprising a first side pad electrode layer and a semiconductor layer having a first side semiconductor surface facing toward said first side pad electrode layer and a second side semiconductor surface opposite to said first side semiconductor surface, said reinforcing plate comprising a first side plate surface facing away from said semiconductor piece and a second side plate surface facing toward said semiconductor piece, and said reinforcing plate being formed with a plurality of through holes extending from said first side plate surface to said second side plate surface;

a second side conductive layer formed on said second side plate surface of said reinforcing plate;

a first side conductive layer formed on said first side plate surface of said reinforcing plate;

a first connecting means comprising a plurality of connecting portions each of which extends in one of said through holes and electrically connects said first side conductive layer with said second side conductive layer, and a connecting layer formed between said first side pad electrode layer and said second side conductive layer for electrically connecting said first side pad electrode layer with said second side conductive layer;

a second side electrode layer formed on said second side semiconductor surface of said semiconductor piece to form the semiconductor device with said first side pad electrode layer so that a main current path of the semiconductor device is vertical between the first side pad electrode layer and the second side electrode layer;

a second connecting means for connecting said second side electrode layer of said semiconductor piece to a first lead conductor; and a third connecting means for connecting said first side conductive layer to a second lead conductor;

wherein said third connecting means comprises a connecting portion of a third conductive bonding material for connecting said first side conductive layer to said second lead conductor and wherein said first, second and third bonding materials are all solders, a melting temperature of said second bonding material is lower than a solidifying temperature of said first bonding material, and a melting point of said third bonding material is lower than a solidifying temperature of said second bonding material; and wherein each of said first side pad electrode layer, said first side conductive layer and said second conductive layer comprises a first section and a second section separated from each other, said first connecting means comprises first and second connecting sections separated from each other, said first section of said second side conductive layer is joined with said first section of said first side pad electrode layer and connected with said first section of said first side conductive layer by said first connecting section of said first connecting means, said second section of said second side conductive layer is joined with said second section of said first side pad electrode layer and connected with said second section of said first side conductive layer by said second connecting section of said first connecting means, said third connecting means comprises a first connecting section for connecting said first section of said first side conductive layer with said second lead conductor, and a second connecting section for connecting said second section of said first side conductive layer to a third lead conductor.

5. An assembly as claimed in claim 4 wherein said assembly further comprises a separating means for preventing said first bonding material from spreading into a boundary zone separating said first and second sections of said second side conductive layer and said first side pad electrode layer.

6. An assembly as claimed in claim 5 wherein said separating means comprises one of a slit formed in at least one of said and second sections of said second side conductive layer, a groove formed in said second side plate surface of said reinforcing plate under at least one of said first and second section of said second side conductive layer, a barrier of a separating material extending between said first and second sections of said second side conductive layer, and a closed stripe of the separating material surrounding said second side ends of said through holes opening in one of said first and second sections of said second side conductive layer, said separating material being a material which is low in wettability with said first bonding material and which is free from thermal metamorphism at a melting temperature of said first bonding material.

7. An assembly as claimed in claim 5 wherein said separating means comprises a stripe of a substantially uniform thickness, made of one of a silicon resin and a polyimide resin, and printed on one of said first side pad electrode layer and said second side conductive layer.

8. An assembly of a semiconductor device, said assembly comprising:

a reinforcing insulator plate for supporting a semiconductor piece comprising a first side pad electrode layer and a semiconductor layer having a first side semiconductor surface facing toward said first side pad electrode layer and a second side semiconductor surface opposite to said first side semiconductor surface, said reinforcing plate comprising a first side plate surface facing away from said semiconductor piece and a second side plate surface facing toward said semiconductor piece, and said reinforcing plate being formed with a plurality of through holes extending from said first side plate surface to said second side plate surface;

a second side conductive layer formed on said second side plate surface of said reinforcing plate;

a first side conductive layer formed on said first side plate surface of said reinforcing plate;

a first connecting means comprising a plurality of connecting portions each of which extends in one of said through holes and electrically connects said first side conductive layer with said second side conductive layer, and a connecting layer formed between said first side pad electrode layer and said second side conductive layer for electrically connecting said first side pad electrode layer with said second side conductive layer;

a second side electrode layer formed on said second side semiconductor surface of said semiconductor piece to form the semiconductor device with said first side pad electrode layer so that a main current path of the semiconductor device is vertical between the first side pad electrode layer and the second side electrode layer;

a second connecting means for connecting said second side electrode layer of said semiconductor piece to a first lead conductor; and a third connecting means for connecting said first side conductive layer to a second lead conductor;

wherein said connecting portions and said connecting layer of said first connecting means are all made of a first conductive layer of said first connecting means are all made of a first conductive bonding material, and said second connecting means comprises a connecting layer of a second conductive bonding material which is formed between said second side electrode layer and said first lead conductor; and wherein each of said first side pad electrode layer and said second side conductive layer comprises a nickel film.

9. An assembly as claimed in claim 8 wherein each of said first side pad electrode layer, and said first and second side conductive layers comprises a metallic base layer, said nickel film formed on said metallic base layer, and a silver film formed on said nickel film.

10. An assembly of a semiconductor device, said assembly comprising:

a reinforcing insulator plate for supporting a semiconductor piece comprising a first side pad electrode layer and a semiconductor layer having a first side semiconductor surface facing toward said first side pad electrode layer and a second side semiconductor surface opposite to said first side semiconductor surface, said reinforcing plate comprising a first side plate surface facing away from said semiconductor piece and a second side plate surface facing toward said semiconductor piece, and said reinforcing plate being formed with a plurality of through holes extending from said first side plate surface to said second side plate surface;

a second side conductive layer formed on said second side plate surface of said reinforcing plate;

a first side conductive layer formed on said first side plate surface of said reinforcing plate;

a first connecting means comprising a plurality of connecting portions each of which extends in one of said through holes and electrically connects said first side conductive layer with said second side conductive layer, and a connecting layer formed between said first side pad electrode layer and said second side conductive layer for electrically connecting said first side pad electrode layer with said second side conductive layer;

a second side electrode layer formed on said second side semiconductor surface of said semiconductor piece to form the semiconductor device with said first side pad electrode layer so that a main current path of the semiconductor device is vertical between the first side pad electrode layer and the second side electrode layer;

a second connecting means for connecting said second side electrode layer of said semiconductor piece to a first lead conductor; and a third connecting means for connecting said first side conductive layer to a second lead conductor;

wherein said connecting portions and said connecting layer of said first connecting means are all made of a first conductive bonding material, and said second connecting means comprises a connecting layer of a second conductive bonding material which is formed between said second side electrode layer and said first lead conductor; and wherein said semiconductor piece comprises a stopper means made of a material different from a semiconductor material of said semiconductor layer, and bared in said ground surface of said semiconductor piece.

11. An assembly as claimed in claim 10 wherein said stopper means comprises a plurality of stopper regions of a dielectric material extending in said semiconductor layer from said first side semiconductor surface to said ground surface.

12. As assembly of a semiconductor device, said assembly comprising:

a reinforcing insulator plate for supporting a semiconductor piece comprising a first side pad electrode layer and a semiconductor layer having a first side semiconductor surface facing toward said first side pad electrode layer and a second side semiconductor surface opposite to said first side semiconductor surface, said reinforcing plate comprising a first side plate surface facing away from said semiconductor piece and a second side plate surface facing toward said semiconductor piece, and said reinforcing plate being formed with a plurality of through holes extending from said first side plate surface to said second side plate surface;

a second side conductive layer formed on said second side plate surface of said reinforcing plate;

a first side conductive layer formed on said first side plate surface of said reinforcing plate;

a first connecting means comprising a plurality of connecting portions each of which extends in one of said through holes and electrically connects said first side conductive layer with said second side conductive layer, and a connecting layer formed between said first side pad electrode layer and said second side conductive layer for electrically connecting said first side pad electrode layer with said second side conductive layer;

a second side electrode layer formed on said second side semiconductor surface of said semiconductor piece to form the semiconductor device with said first side pad electrode layer so that a main current path of the semiconductor device is vertical between the first side pad electrode layer and the second side electrode layer;

a second connecting means for connecting said second side electrode layer of said semiconductor piece to a first lead conductor; and a third connecting means for connecting said first side conductive layer to a second lead conductor;

wherein said third connecting means comprises a connecting portion of a third conductive bonding material for connecting said first side conductive layer to said second lead conductor and wherein said first, second and third bonding materials are all solders, a melting temperature of said second bonding material is lower than a solidifying temperature of said first bonding material, and a melting point of said third bonding material is lower than a solidifying temperature of said second bonding material; and wherein said reinforcing insulator plate is made of a sintered insulting material, and said connecting portions of said first connecting means are made of a sintered conductive material.

13. A composite semiconductor structure comprising:

a first piece comprising a semiconductor wafer and a pad electrode layer comprising a plurality of electrically separated electrode regions formed on a first side semiconductor surface of the semiconductor wafer;

a second piece comprising a reinforcing insulator plate which is formed with a plurality of through holes, and a second side patterned conductive layer which is formed on a second side plate surface of the reinforcing insulator plate and which comprises a plurality of electrically separated second side interconnection regions; and a connecting layer which is sandwiched between the first and second pieces to join the first and second pieces together and which comprises a plurality of electrically separated connecting regions each of which is spread between one of the second side interconnection regions of the second piece and one of the electrode regions of the first piece to electrically connect one of the electrode regions with a unique one of the second side interconnection regions.

14. A composite semiconductor structure as claimed in claim 13 wherein the semiconductor wafer comprises a plurality of sections each of which corresponds to a single semiconductor chip, and the first side semiconductor surface of the semiconductor wafer is entirely covered by the reinforcing insulator plate.

15. A composite semiconductor structure as claimed in claim 13, wherein the second piece further comprises a second patterned conductive layer which is formed on a first side plate surface of the insulator plate and which comprises a plurality of electrically separated first side interconnection regions, and a plurality of connecting portions each extending through one of the through holes and electrically connecting one of the first side interconnection regions with one of the second side interconnection regions so that each of the first side interconnection regions is electrically connected with a unique one of the second side interconnection regions.

* * * * *